United States Patent [19]
Reesor

[11] Patent Number: 5,991,784
[45] Date of Patent: Nov. 23, 1999

[54] SIGNAL PROCESSING CIRCUIT

[75] Inventor: Gordon J. Reesor, Ottawa, Canada

[73] Assignee: Mitel Corporation, Kanata, Canada

[21] Appl. No.: 08/765,205

[22] PCT Filed: Jul. 6, 1995

[86] PCT No.: PCT/CA95/00400

§ 371 Date: Apr. 24, 1997

§ 102(e) Date: Apr. 24, 1997

[87] PCT Pub. No.: WO96/01527

PCT Pub. Date: Jan. 18, 1996

[30] Foreign Application Priority Data

Jul. 6, 1994 [CA] Canada .................................. 2127520

[51] Int. Cl.$^6$ .............................. G06F 7/00; G06F 7/44
[52] U.S. Cl. ........................................ 708/203; 708/503
[58] Field of Search ........................ 364/748.09, 715.02, 364/724.19

[56] References Cited

U.S. PATENT DOCUMENTS 4,799,182  1/1989  Marwood ........................... 364/748.09
4,858,163  8/1989  Boreland ............................ 364/748.16

FOREIGN PATENT DOCUMENTS 0 334 714   9/1989   European Pat. Off. .
2 218 548   11/1989  United Kingdom .

OTHER PUBLICATIONS

Shanbhag et al, "A high-speed Architecture for ADPCM Codec", 1992 IEEE Int. Symposium on Circuits and systems, vol. 3 of 6, pp. 1499–1502, May 10, 1992.

Aly, "24–Channel 32Kb/s ADPCM Transcoder Using the CCITT Recommendation g. 721", ICASSP 86 Proceedings vol. 1, pp. 349–352, Apr. 1986.

*Primary Examiner*—Tan V. Mai
*Attorney, Agent, or Firm*—Marks & Clerk

[57] ABSTRACT

A circuit for applying a predetermined algorithm to an input signal, has an input for receiving the input signal, a signal processing device for processing the input signal in accordance with the predetermined algorithm, and a device for outputting the processed signal. The signal processing device incorporates distributed bit-serial logic circuits to implement the predetermined algorithm.

13 Claims, 10 Drawing Sheets

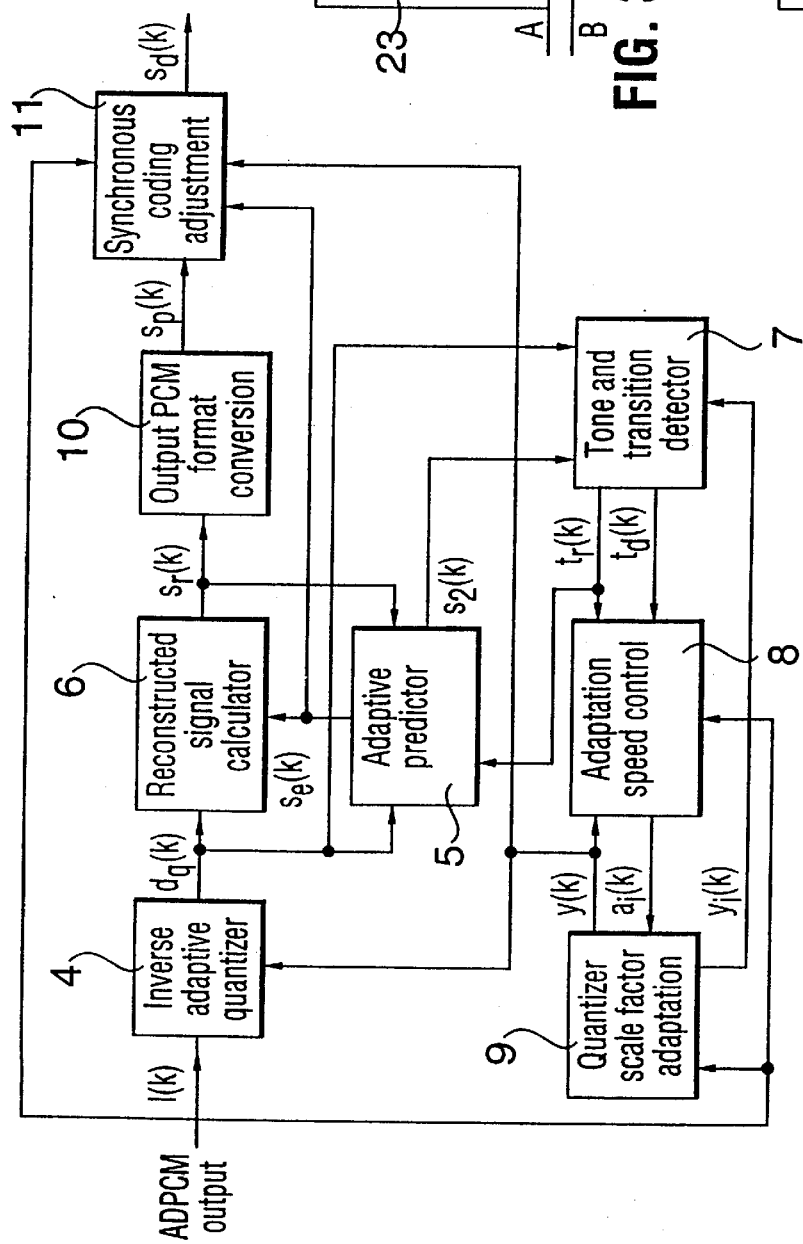
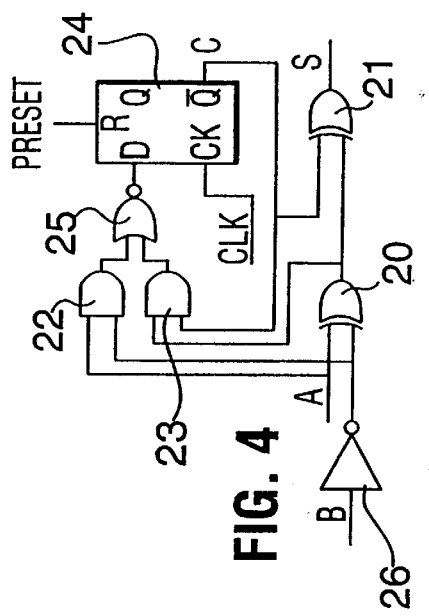
FIG. 3
FIG. 4
FIG. 2
PRIOR ART

SIGNAL PROCESSING CIRCUIT This invention relates to a circuit for applying a predetermined algorithm to an input signal.

Such a circuit may be, for example, a circuit for encoding or decoding speech samples using ADPCM (Adaptive Differential Pulse Code Modulation).

ADPCM (Adaptive Differential Pulse Code Modulation) is a digital signal processing algorithm designed to reduce the bandwidth of Pulse Code Modulated Speech samples. CCITT recommendation G.721 (Melbourne 1988) describes the algorithm in detail as it pertains to the conversion of 64 kb/s µ-law or A-law PCM encoded speech to and from a 32 kb/s compressed format. ANSI recommendation T1-303, and CCITT rec G.726 are similar documents with extensions to 40 k/s and 24 kb/s and 16 kb/s bit rates. The actual implementation of an ADPCM algorithm in a real time speech processing application may take various different forms ranging from a computer program, instruction code on a commercially available DSP chip, ASIC logic chip, or a custom integrated circuit.

This invention is concerned with implementation in the form of a custom chip. In the prior art, implementation has been achieved in this form by employing microprocessor technology using a high speed clock to run a circuit consisting of a multiplexed ALU (arithmetic logic unit) circuit, state machine, or micro-coded instruction based processor. The algorithm has to be coded as a stored program, and the power consumption involved is very substantial when fetching instructions, decoding and executing the instructions, which requires large data buses to be pulled up and down, continually charging and discharging CMOS transistor gates. Furthermore a lot of instructions are required to execute the program.

Analysis of prior art ADPCM devices available reveals that power consumption has not been optimized. In practice, the minimum power requirements are in the order of several hundred milliwatts.

Particularly in Pair Gain (twisted pair line quadrupling) applications and Cordless Digital telephones (e.g. Personal Handy Phone handsets and base-stations), power consumption is becoming a major preoccupation of circuit designers.

Pair Gain is a method of increasing the number of subscribers that may simultaneously use a single analog twisted pair telephone line for independent two-way conversations. A/D and D/A converters (CODEC'S) are used to digitize the speech channels into 64 kb/s A-law or µ-law PCM, after which one or more ADPCM devices are used to compress the 64 kb/s streams to 32 kb/s. These 32 kb/s channels are then merged into a single ISDN Ubus transceiver device to transmit the digitized signals as one 144 kb/s (2B+D) base-band modem signal onto a single twisted pair copper cable. At the distant end of the cable, similar devices are used to reconvert the signals back to analog form to interface with separate analog telephones.

Pair Gain equipment is used in locations where the cost of installation of copper pair cable for additional telephone lines proves to be prohibitively expensive (or more expensive than the Pair Gain equipment).

Because it is desirable that the Pair Gain equipment circuitry be line powered (i.e. powered by DC on the line itself), it is necessary that the power consumption of the devices used be minimized. There is a relationship between maximum line length possible with the Pair Gain equipment and the power consumption of the circuit. This means that the current consumption of the ADPCM device directly affects performance parameters of the Pair Gain product.

Cordless digital telephones that conform to the CT2 (Cordless Telephone 2) specification or other specifications use a codec to convert signals from analog to digital and back, as well as ADPCM compression to 32 kb/s to reduce the bandwidth of the digital signal before transmission. Since the telephone set must be battery operated, the power consumption of the components will directly affect the number of hours of usage before the battery must be recharged. This means that the current consumption of the ADPCM device directly affects performance parameters of a cordless telephone product.

U.S. Pat. No. 4,858,163 describes a serial arithmetic processor which is arranged to perform complex arithmetic functions of the ADPCM algorithm. This patent (U.S. Pat. No. 4,858,163) relates to a common means serial arithmetic processor (SAP) for efficiently performing certain selected complex arithmetic functions in the ADPCM algorithm, intended for use along with a micro-coded processor to implement the main body of ADPCM algorithm. The micro-coded processor has a 16 bit bus connected to a RAM, an ALU core, and a 1024×29 bit ROM. The Serial Arithmetic Processor is attached to this micro-coded processor via the multiplexed 16 bit bus.

The objects of this prior art patent are to provide an SAP comprising a common means to efficiently perform complex arithmetic functions such as LOG, ANTILOG, FLOATING POINT MULTIPLICATION and SIGNED MAG MULTIPLICATION. The advantage of this design is stated to be a replacement for arithmetic functions which are burdensome to implement using the available instruction sets of presently available digital signal processing chips. This appears to be the only advantage, and the actual reasons for choosing serial logic circuitry are not well documented.

U.S. Pat. No. 4,791,590 discloses the use of bit-serial logic circuits for carrying fast Fourier Transform operations. It does not, however, disclose an architecture suitable for low-power ADPCM applications, such as are found in cordless telephones.

British patent no. 2,218,548 discloses a special purpose Digital Signal Processor for implementing ADPCM in a cordless phone. However, this processor uses mostly 16-bit parallel logic, which results in unnecessarily power consumption.

An object of the invention is to provide a circuit capable of implementing the ADPCM algorithm with reduced power consumption.

According to the present invention there is provided a circuit for applying an adaptive differential pulse code modulation compression algorithm to an input signal, comprising an input for receiving said input signal, signal processing means for processing said input signal in accordance with said algorithm, wherein the signal processing means comprises distributed bit-serial logic circuits and includes an adaptive predictor having a parallel array of bit-serial floating point multipliers whose outputs are connected to respective adders, where they are summed serially to produce an output.

This arrangement offers considerable advantages both in terms of the reduction in logic circuitry and power consumption. Bit serial logic circuitry has a substantially lower power consumption than parallel logic circuitry.

The present invention has a significant advantage over the prior art, particularly U.S. Pat. No. 4,858,163, in that a micro-program processor architecture is not used. In accordance with the invention, all arithmetic functionality of the ADPCM algorithm is implemented as a parallel array of bit serial logic such that each arithmetic function is separate and not multiplexed (i.e. there are no common means for execution of different arithmetic functions). The ADPCM algorithm is actually hard wired into the connection of separate bit serial circuits. Such an implementation has a more optimal way of performing arithmetic calculations from the point-of-view of low power consumption. The burden of fetching decoding and executing stored instructions is avoided.

An example of why a stored micro-code implementation is less efficient will be described. Assume that a functional step in a DSP algorithm requires a single bit to be set or cleared in a 16 bit binary register variable, which is stored in ram. The micro-coded processor has to read this entire variable (all 16 bits) out of the RAM, move it to an ALU (arithmetic logic unit), then set or clear the appropriate bit using logical instructions, and then move the result back to RAM. This whole sequence of operations has the overhead of instruction fetch/decode/and execution from memory, as well as activity on the internal data bus for each of the 16 bits of the entire variable, as well as one or more ALU operations. In contrast, the corresponding logic designed specifically to implement this operation is as simple as directly setting or clearing a single flip-flop in a register. This therefore corresponds to a drastic reduction in total power drawn for this simple operation (when CMOS logic gates are used).

The overall implementation of a DSP algorithm using bit serial logic must therefore in general be a lower power solution than that of the same implemented in a stored micro-programmable DSP even with some of the more burdensome operations designed into a SAP as in the above patent.

In accordance with the present invention the QUANTIZER, INVERSE QUANTIZER, FORMAT CONVERSION, DIFF signal computation, TONE/TRANSITION detector, SCALE FACTOR, SPEED CONTROL filters are all implemented as bit serial logic circuits in serial hardware as opposed to software. The FMULT operation which is the floating point multiply operation inside the ADAPTIVE PREDICTOR is probably the most arithmetically complex operation in the ADPCM algorithm. The present invention does not use a parallel adder, and instead sums partial products together through an array of six serial adders to produce the final product in bit serial form which is shifted into shift register. In the CCITT FMULT definition, the product of the multiplication must be shifted according to the result of the addition of exponents. Most data transfers are done serially, consequently data shift operations are accomplished simply by delaying a serial stream of data. This data shift is implemented by delaying the data in a shift register depending upon the result generated by an exponent adder, 5 bit loadable down counter, and decode/control logic.

Arithmetic operations such as additions, subtractions, 2's complement inversions, multiplications etc., require large amounts of logic gates if implemented in parallel. If instead, the operations are done serially, bit by bit beginning with the least significant bits, then the required amount of logic reduces significantly.

Preferably said predetermined algorithm is an ADPCM compression/decompression algorithm.

The implementation of the circuit is in the form of a Custom Integrated Circuit using standard cell 2 $\mu$m CMOS silicon technology. The implementation follows the CCITT/ANSI recommendations for 32 kb/s and 24 kb/s ADPCM in terms of arithmetic processing; however, the use of distributed bit-serial logic implementation have resulted in substantially lower power consumption than the prior art, namely in the order of 10–12 mwatts for one encoder and one decoder using a 5 v power supply, or 3–5 mWatts using a 3 V power supply.

The invention will now be described in more detail, by way of example only, with reference to the accompanying drawings, in which:

FIG. 2 is a block diagram of an ADPCM decoder operating according to CCITT standard G.726;

FIG. 3 is a circuit of a bit serial adder in accordance with one embodiment of the invention;

FIG. 4 is a circuit of a bit serial subtracter in accordance with one embodiment of the invention;

Figure 1:
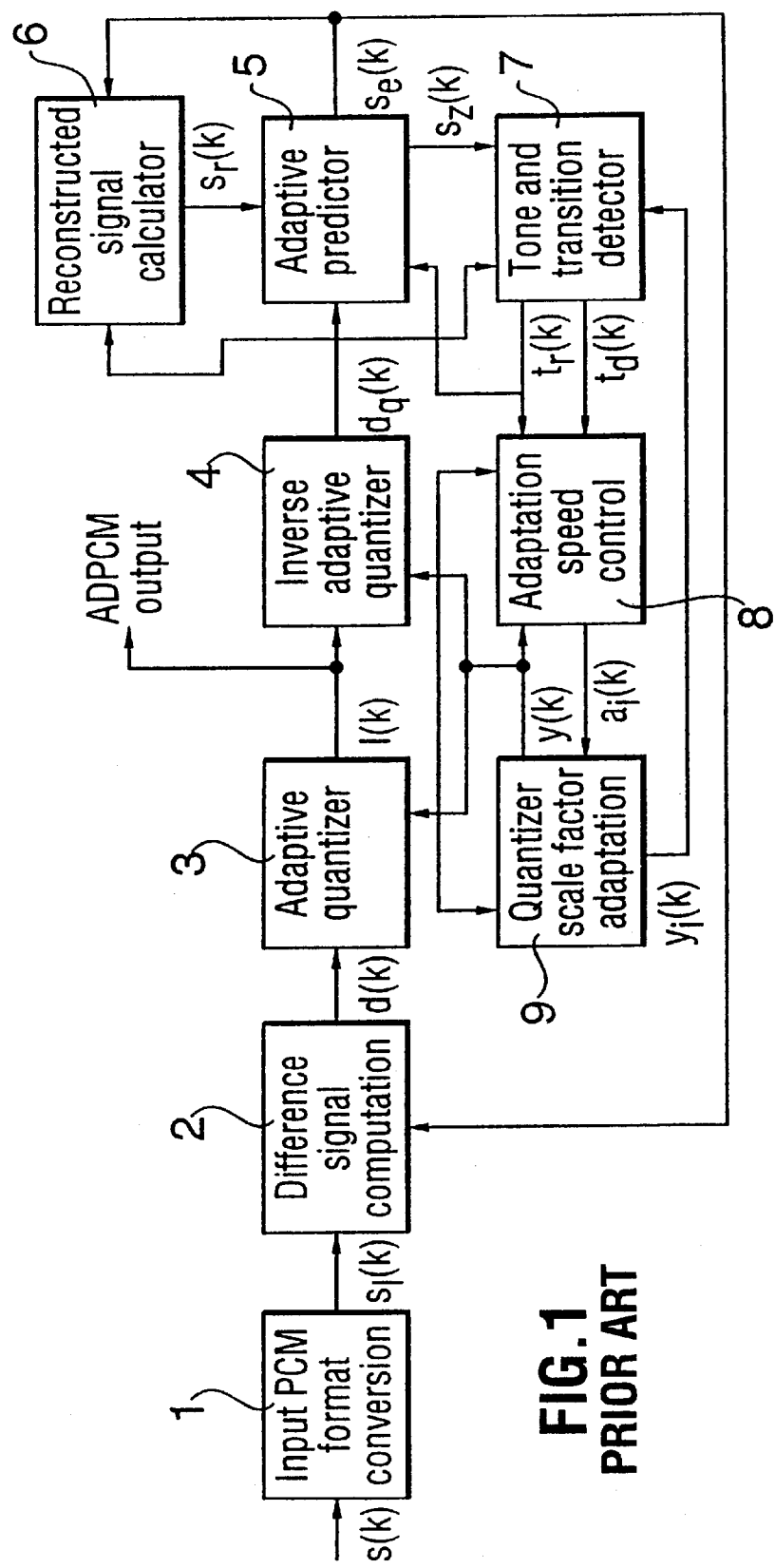
FIG. 1 is a block diagram of an ADPCM encoder operating according to CCITT standard G.726.

FIG. 1 shows a block diagram of a circuit implementing the ADPCM algorithm as defined in CCITT specifications. In FIG. 1, the 64 kb/s ADPCM input stream s(k) is input to a ADPCM format converter 1 connected to difference signal unit 2. The difference signal d(k) is fed to adaptive quantizer 3, which produces an output signal I(k) that is input to inverse adaptive quantizer 4 producing an output $d_q(k)$ input to adaptive predictor 5. The outputs of inverse adaptive quantizer 4 and adaptive predictor 5 are respectively applied as inputs to reconstructed signal calculator 6 whose output $s_r(k)$ is applied to adaptive predictor 5.

The output of inverse adaptive quantizer $d_{(k)}$ is also applied to tone transition detector 7, along with an output of adaptive predictor 5, and the output of tone and transition detector 7 is applied to adaptive speed control unit 8, in turn connected to quantizer scale factor and adaptation unit 9. The ADPCM output appears at the input to inverse adaptive quantizer 4.

The encoder circuit FIG. 1 is specified in document CCITT G.726, to which the reader is referred. Throughout this specification the processing variables will be identified using the same terminology as is employed in this document.

FIG. 2 shows a decoder circuit which receives at its input an ADPCM signal and provides at its output a PCM signal $s_d(k)$. The individual component of the circuits of FIG. 2 are generally similar to those of FIG. 1, and like reference numbers are employed where appropriate. The output of the reconstructed signal calculator 6 is applied to an output PCM format conversion circuit 10, which in turn is connected to a synchronous coding adjustment circuit 11. This is circuit is also described in detail in CCITT document G.726. In FIGS. 1 and 2, the illustrated blocks 1 to 9 and 4 to 11 respectively constitute signal processing means for applying an ADPCM compression algorithm to an input signal. The circuit of FIG. 1 compresses the signal and the circuit of FIG. 2 decompresses it using the same basic algorithm. When implemented in parallel logic, the circuits shown in FIGS. 1 and 2 constitute prior art Referring now to FIG. 3, the bit serial adder comprises an exclusive OR gate 20 having inputs A and B and an output connected to one input of an exclusive OR gate 21. The inputs of AND gate 22 are also connected to respective inputs A and B, and the inputs of AND gate 23 are respectively connected to output of exclusive OR gate 20 and a second input of exclusive OR gate 21, which in turn is connected to the Q⁻ output of bistable flip flop 24. The outputs of AND gates 22 are connected through NOR gate 25 to the D input of flip flop 24.

Arithmetic operations such as additions, subtractions, 2's complement inversions, multiplications etc., require large amounts of logic gates if implemented in parallel. If instead, the operations are done serially, bit by bit beginning with the least significant bits, then the required amount of logic reduces significantly.

The following example illustrates an example of serial addition with reference to FIG. 3. If for example two operands of length 16 bits are to be added together, then the operands are shifted in serially LSB (Least Significant Bit) first into inputs A and B, with resulting serial sum at output S.

The XOR gates 20, 21 perform the single bit 2's complement addition, and the carry bit generated by the AND/OR combination is latched and used during the next single bit addition. Initialization of the latched carry bit C is done using the signal PRESET before the first addition of the LSB'S.

A simple change in this circuit, wherein inverter 26 is added to the B input of exclusive OR gate 20, produces a 2's complement subtracter as shown in FIG. 4. The PRESET on the flip-flop has changed from a SET to a RESET function, which effectively causes the first carry bit C to be a ONE, and the B input bits are all complemented resulting in a 2's complement addition of (A plus the one's complement of B plus ONE).

This methodology can be easily extended to implement any arithmetic or logical function, including multiplication. Delays or register storage are implemented using shift registers, which are clocked only when needed.

Figure 5:
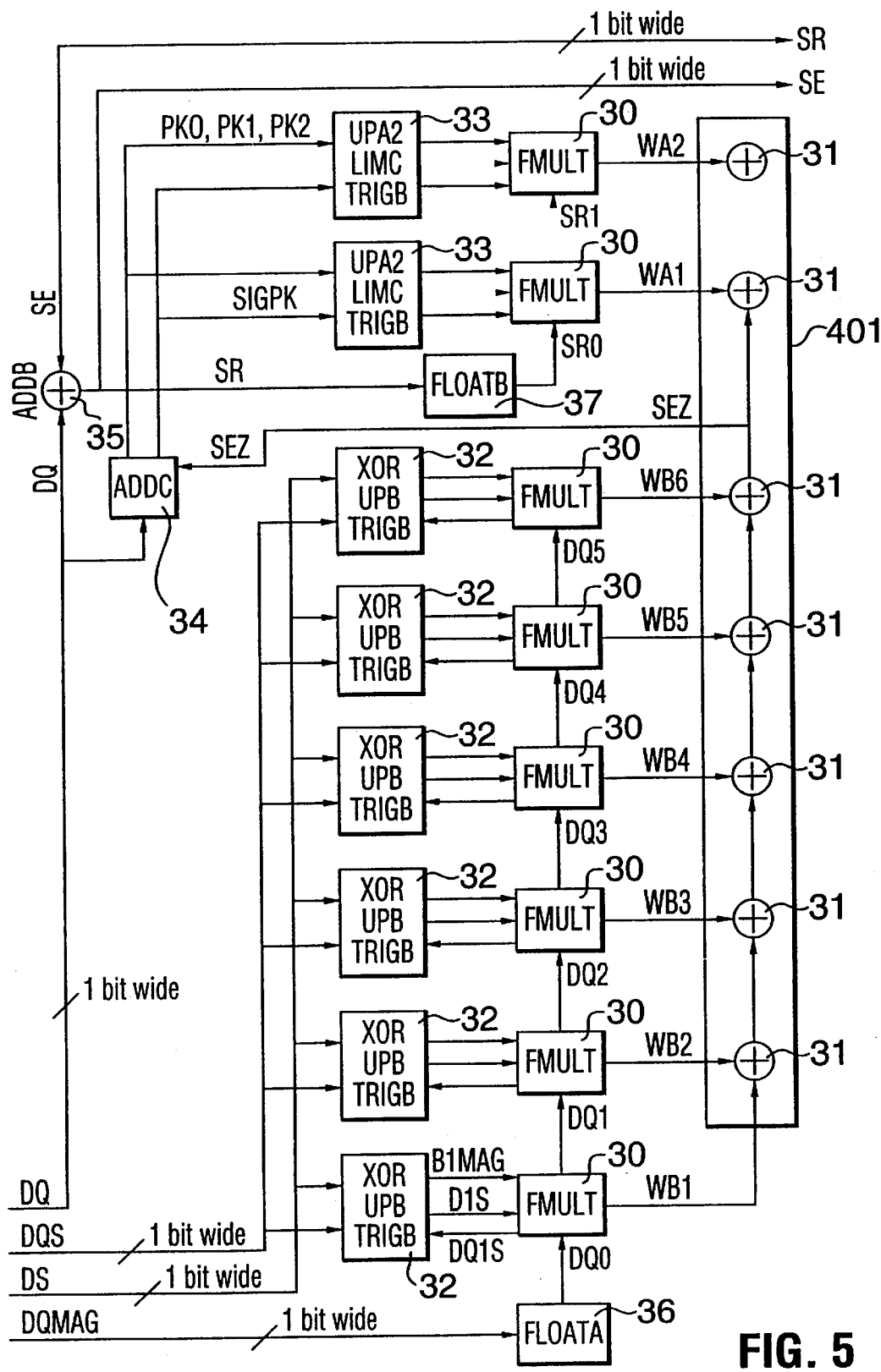
FIG. 5 is a block diagram of an adaptive predictor as defined by CCITT specifications.
Figure 10:
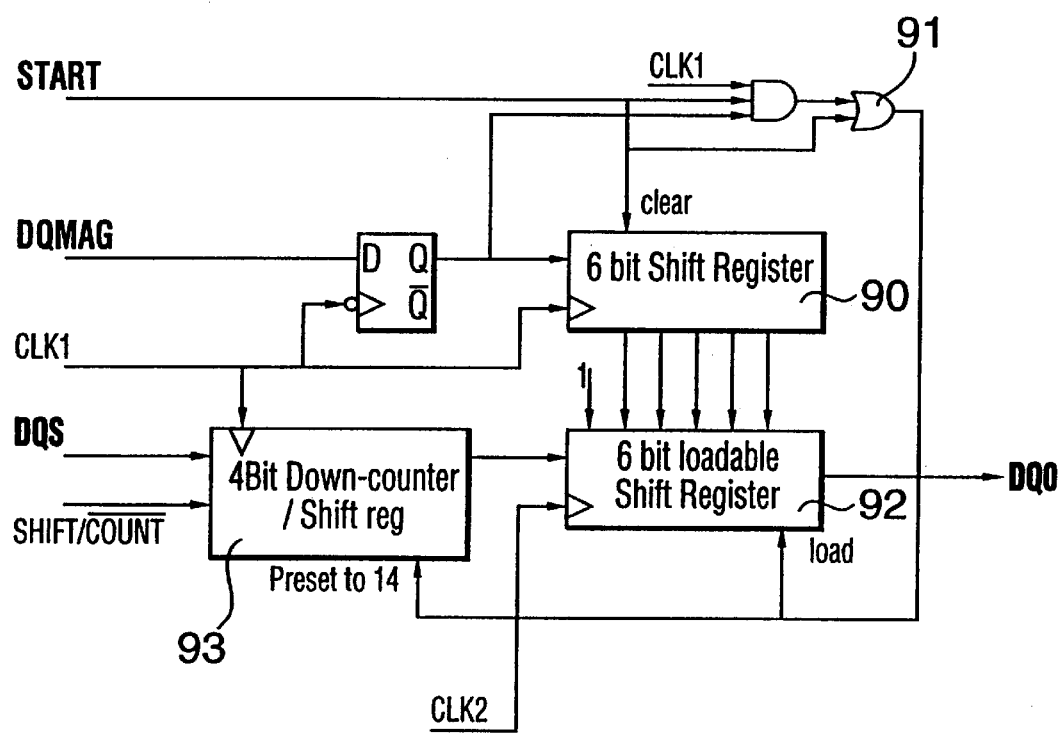
FIG. 10 is a floating point conversion circuit (FLOATA)

Turning now to FIG. 5, this illustrates an adaptive predictor unit 5 of FIGS. 1 and 2 implemented using serial logic in accordance with the invention. In FIG. 5, the adaptive predictor comprises a parallel array of six FMULT bit serial logic units 30 connected to respective bit serial adders 31, each FMULT unit 30 producing serial bit streams WB1 to WB6. Floating point converter 36, shown in more detail in FIG. 10, provides an input to the array. A second parallel array of two floating point multipliers 30 receives an input from floating point converter 37, shown in more detail in FIG. 12, and outputs signals WA1, WA2. These bit streams are summed in the adders 31, which produce outputs SE and SEZ as required by the ACCUM operation defined in the CCITT specifications.

The first six FMULT units 30, producing outputs WB1 to WB6, are connected to combined XOR, UPB and TRIGB predictor units 32 (shown in more detail in FIG. 9), whereas the remaining FMULT units 30 producing outputs WA1, WA2 are connected to predictor units 33.

The circuit of FIG. 5 generally operates in accordance with the CCITT G.726 ADPCM.

Figure 6:
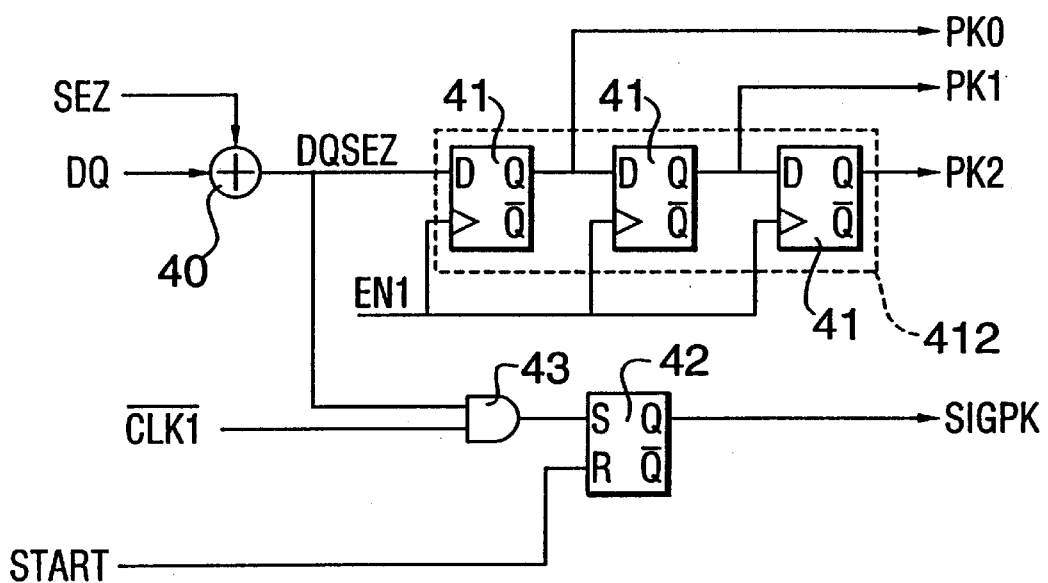
FIG. 6 is an ADDC implementation circuit.

Turning now to FIG. 6, this shows a bits serial logic circuit in accordance with the invention, which implements ADDC operation (block 34 in FIG. 5) as well as PK delays (inputs to predictors 33 in FIG. 5) as defined in CCITT G.726.

In FIG. 6, serial streams SEZ and DQ are summed in serial adder 40 to form a resulting signal DQSEZ which is latched into flip flops 41 at the appropriate time using clock signal EN1, which is generated elsewhere in the chip. The outputs of the flip flops 41 form signals PK0, PK1, and PK2 respectively. RS latch 42 generates an output SIGPK by first clearing SR latch output low using reset signal START which occurs before serial adder 40 begins its calculation. Each bit of the resulting signal DQSEZ is gated with clock $\overline{CK1}$ using AND gate 43 to deglitch the bit signals to form a set signal to SR latch 42. In the event that any of the bits of DQSEZ are logic high, SR latch 42 will be set high causing SIGPK to become logic high.

Figure 7:
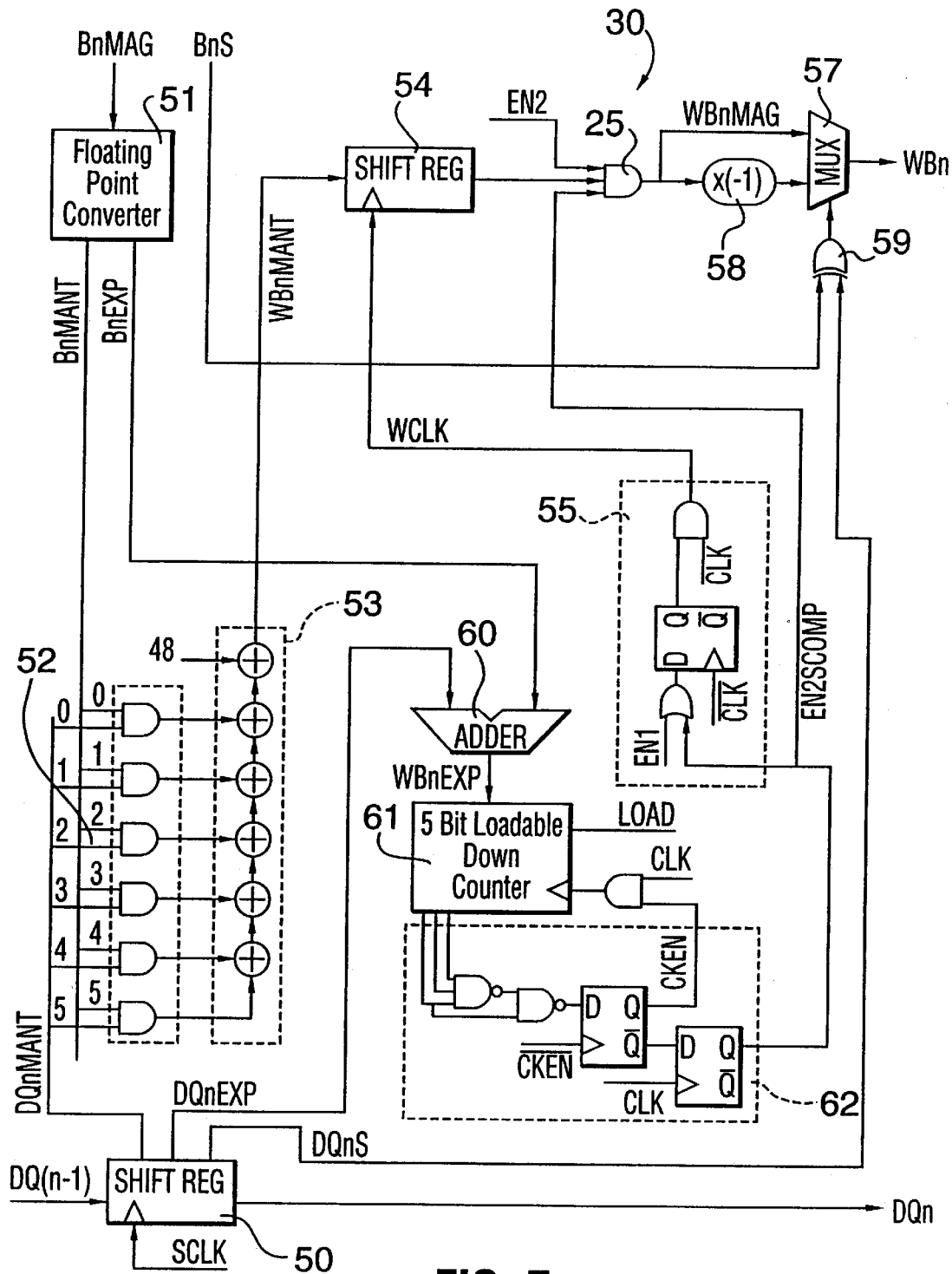
FIG. 7 is a floating point multiplier unit (FMULT)

FIG. 7 shows in detail a floating point multiplier block 30 (FMULT) implemented as a bit serial logic circuit. In FIG. 7, DQn signals shift serially through Shift Register 50 to implement to the DQ0 to DQ6 delay line. Shift Register 50 is tapped off in parallel to provide the components of the DQn (Quantized Difference) signal to the floating point multiplier. These components are the six bit wide DQnMANT, the four bit wide DQnEXP, and the single bit DQnS, and are available to be used by the floating point multiplier when Shift Register 50 is static, i.e. when SCLK is not active.

The other input to the floating point multiplier is from 13 bit linear magnitude BnMAG and sign bit BnS. BnMAG is shifted serially into floating point converter 51 and converted into six bit wide BMANT signal and four bit wide BnEXP signal. BnMANT and DQnMANT are gated together through AND gate array 52 and serial adder array 53 to form the result WBnMANT, which is a 12 bit serial bit stream representing the mantissa of the product.

To understand how this multiplication works, it must be realized that the six bit bus DQnMANT is a collection of static signals representing a multiplicand, but the six bit bus BnMANT is not a static bus and is actually a collection of shifted serial bit streams generated by the floating point converter 51. The following shows the serial bit streams as defined on each signal of BnMANT, shifted LSB first.

|            | MSB            | LSB            |
|------------|----------------|----------------|
| BnMANT (0) | 0 0 0 0 0 0    | 1 $b_4 b_3 b_2 b_1 b_0$ |
| BnMANT (1) | 0 0 0 0 0 1    | $b_4 b_3 b_2 b_1 b_0$ 0 |
| BnMANT (2) | 0 0 0 0 1 $b_4$ | $b_3 b_2 b_1 b_0$ 0 0 |
| BnMANT (3) | 0 0 0 1 $b_4 b_3$ | $b_2 b_1 b_0$ 0 0 0 |
| BnMANT (4) | 0 0 1 $b_4 b_3 b_2$ | $b_1 b_0$ 0 0 0 0 |
| BnMANT (5) | 0 1 $b_4 b_3 b_2 b_1$ | $b_0$ 0 0 0 0 0 |

The above can also be written as BnMANT(n) <<n, i.e. a bit shift to the right of n bits. These serial streams are then gated through AND gates 52 and summed serially in summers 53 to produce the sum of partial products. Additionally a value of 48 is added to the result as per requirement in CCITT G.726FMULT description.

The result WBnMANT is shifted into shift register 54 clocked by logic circuit 55, the clock from which is enabled by strobe EN1, which is generated elsewhere in the chip. Only the eight most significant bits of WBnMANT are kept, the four LSB'S are discarded, thus shift register 54 is an 8 bit register. The value held in shift register 54 is held for a period of time and then shifted out at an appropriate time to generate 16 bit serial signal WBn. AND gate 56 is used to remove unwanted bits from WBnMAG which is then converted from a magnitude format to a 2's complement format by MUX circuit 57 to generate WBn in serial fashion. MUX 57 is used to select either the magnitude WBnMAG or the 2's complement of WBnMAG generated by serial complement circuit 58. MUX 57 is controlled by XOR gate 59, the inputs of which are the sign bits of the multiplier BnS and multiplicand DQnS.

The period of time that register 54 is held static is determined by exponent adder 60, 5 bit loadable down counter 61, logic circuit 62, and logic circuit 55, the operation of which will be explained next. Exponent adder 60 adds BnEXP to DQnEXP and produces a 5 bit result WBnEXP. WBnEXP is used as the preset value loaded into a 5 bit down counter 61. The three most significant bits of this down counter are decoded by logic circuit 55 to generate signal CKEN. If a value greater than or equal to 11 is loaded into the counter then the clock to the down counter becomes enabled by CKEN. When the counter reaches a count of 11 then CKEN will stop the clock to the counter freezing the count at 11. Signal EN2SCOMP is also generated and conditioned by circuit 55 to produce the clock WCLK used to clock shift register 54. The delay before WCLK is started is dependent upon the value of WBnEXP produced by the summation of exponents 60, and the number of clock cycles before the down counter reaches a count of 11. This implements the required shifting to scale WBnMAG as per CCITT G.726.

Figure 8:
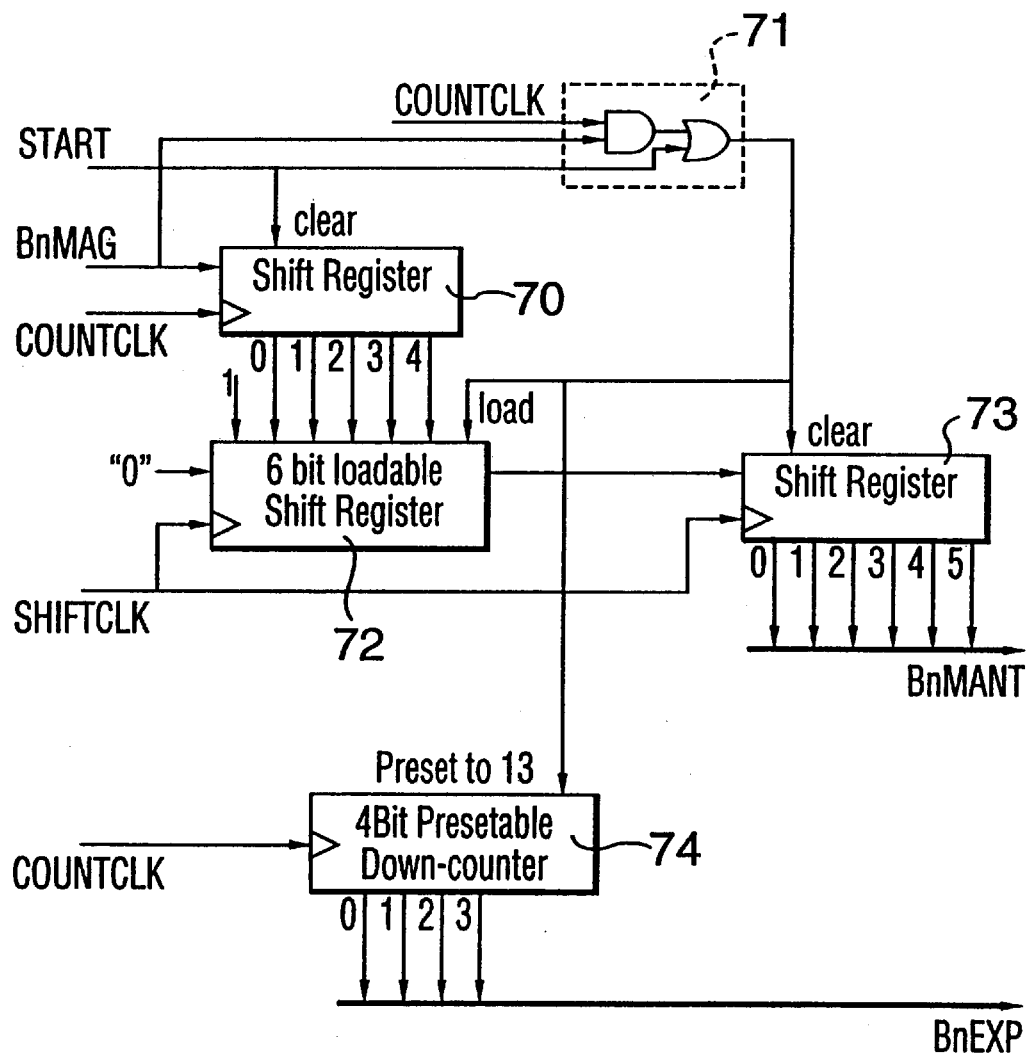
FIG. 8 is a block diagram of an FMULT floating point converter.

The Floating Point Converter block 51 is shown in FIG. 8. A 6 bit shift register 70 is first cleared by the START signal, which also initializes through OR gate 71, the loadable shift register 72, to the binary value "100000", shift register 73 of all zeros, as well as counter 74 to a count of 13. Serial input signal BnMAG is shifted into least significant bit first using a clock signal COUNTCLK. When a logic "1" bit is encountered in the BnMAG stream, three things happen, firstly the least significant 5 bits of shift register 70 are loaded into loadable shift register 72 along with a logic "1" bit in the most significant bit position, secondly output shift register 73 is cleared to all zeros (actually a redundant operation), and thirdly 4 bit down counter 74 is preset to a count of 13. The loadable shift register 72 now contains the previous 5 bits in the BnMAG stream before the logic "1" was detected, along with a "1" in the most significant bit position. Since a multiple number of occurrences of "1" may occur in the BnMAG input stream, this load process is repeated until the last occurrence of a "1" is found. Every subsequent "0" in the BnMAG stream will have no effect upon the circuit except that the down counter 74 will decrement by 1 count. After the last bit of BnMAG has been clocked into shift register 70, COUNTCLK is disabled and SHIFTCLK becomes active. The value left in the down counter 74 is the desired exponent value BnEXP, which is output from the circuit in parallel fashion. Loadable shift register 72, is shifted serially through shift register 73 to produce the shifted bit streams shown in the table above.

Figure 9:
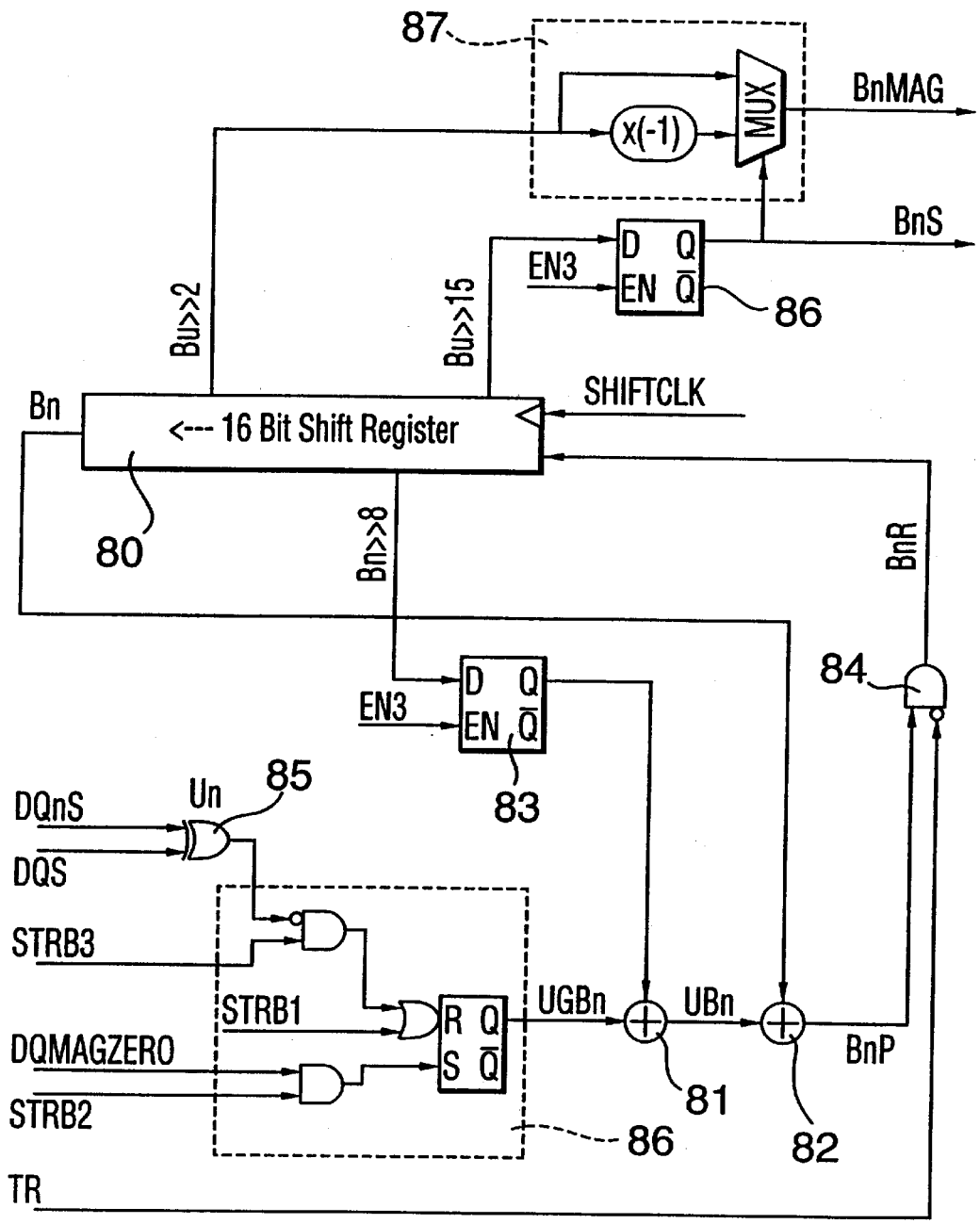
FIG. 9 shows a Prediction Coefficient Update Circuit (UPB, XOR, TRIGB)

The Predictor Coefficient Update (UPB) block is shown in FIG. 9. This circuit performs an adaptive coefficient update for the predictor filter. The outputs of this circuit provide the multiplier input to an FMULT floating point multiplier circuit shown in FIG. 7. The 16 bit 2's complement representation of the filter coefficient Bn is stored in shift register 80. During adaptation, clock signal SHIFTCLK becomes active shifting the register contents through serial adders 81 and 82. Signal Bn>>8 is a signal tapped from the 8th flip-flop of the shift register and represents the value of Bn shifted right by 8 bits. Latch 83 allows signal Bn>>8 to pass through transparently until the most significant bit (the sign bit) of Bn>>8 is present at the output of latch 83, the latch enable EN3 (from elsewhere in the chip) is then changed to logic "O" causing the sign bit of Bn>>8 to become latched so as to extend the sign bit through subsequent bit periods so as to effect a 2's complement sign bit extension. AND gate 84 clears serial bit stream BnP to all zeroes when input signal TR is asserted to logic "1" to implement the TRIGB definition as per CCITT G.726. XOR gate 85 implements the XOR operation on input sign bits DQS and DQnS to generate signal "Un" as per CCITT definition. Logic gates 86 along with input strobe pulses STRB1, STRB2, and STRB3, generate signal UGBn which is one of 3 possible 2's complement serial codes (+80hex, −80hex, or 0).

Simultaneously with coefficient update previously described, signals BnMAG and BnS are produced and transmitted to the FMULT circuit. The sign bit of Bn (labeled as Bn>>15) is tapped-off the shift register at the rightmost bit position. This signal is latched at the appropriate time by signal EN3 to latch 86 to hold the sign bit BnS. Bn>>2 is also tapped-off the shift register two positions from the left most end of the register and passed through serial circuit 87 which converts the 2's complement representation of Bn>>2 to signed magnitude representation BnMAG. The operation of this conversion circuit is similar to the one in the FMULT circuit.

The FLOATA block shown in FIG. 10 converts a 15 bit signed magnitude DQMAG signal along with sign bit DQS to floating point representation for use by the FMULT floating point multipliers. The inputs and outputs of this circuit are serial format least significant bit first.

Shift register 90 is first cleared by the START signal, which also initializes through OR gate 91, the loadable shift register 92, and 4 bit down counter 93. Serial input signal DQMAG is shifted into shift register 90 least significant bit first using clock signal CLK1. When a logic "1" bit is encountered in the DQMAG stream, two things happen, firstly the least significant 5 bits of shift register 90 are loaded into loadable shift register 92 along with a logic "1" bit in the most significant bit position, and secondly the 4 bit down counter 93 is preset to a count of 14.

Figure 11:
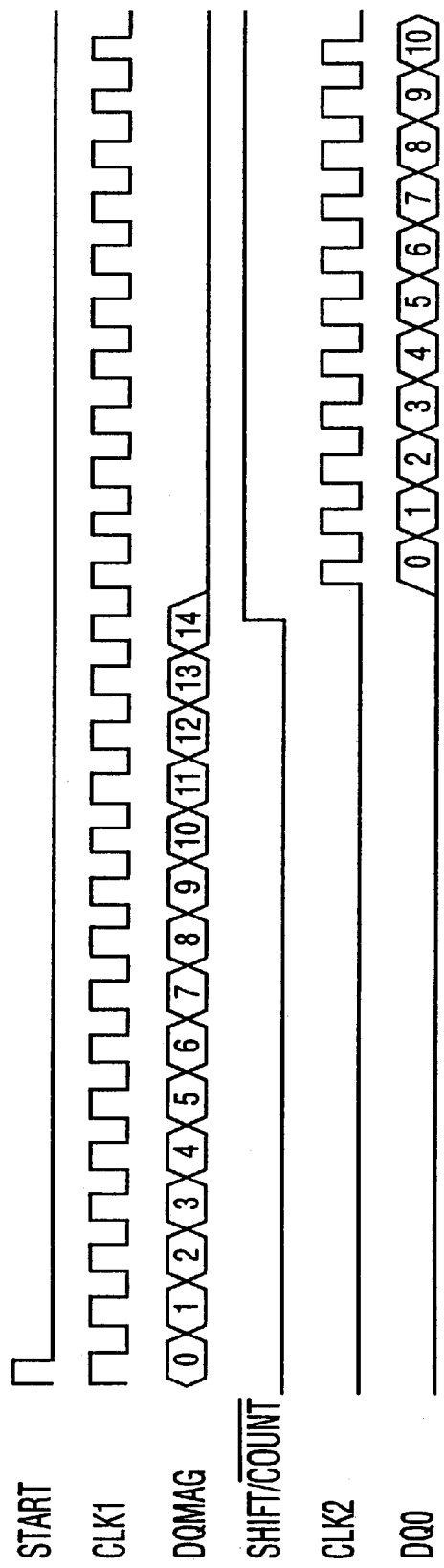
FIG. 11 is a timing chart for the circuit of FIG. 10.

The loadable shift register 92 will now contain the previous 5 bits in the DQMAG stream before the logic "1" was detected, along with a "1" in the most significant bit position. Since a multiple number of occurrences of "1" may occur in the DQMAG input stream, this load process is repeated until the last occurrence of a "1" is found. Every subsequent "0" in the DQMAG stream will have no effect upon the circuit except that the down counter 93 will decrement by 1 count. After the last bit of DQMAG has been clocked into shift register 90, CLK2 becomes active (CLK1 remains active) and 4 bit down counter 93 stops counting and switches its function to that of a shift register; the change in function being indicated by control input COUNT/SHIFT generated elsewhere on the chip. The value left in the down counter is the desired exponent value DQEXP, which along with input sign bit DQS becomes serially connected to shift register 92 and the final result DQO is shifted out serially using CLK1 and CLK2. The input and output signals are shown in FIG. 11.

Figure 12:
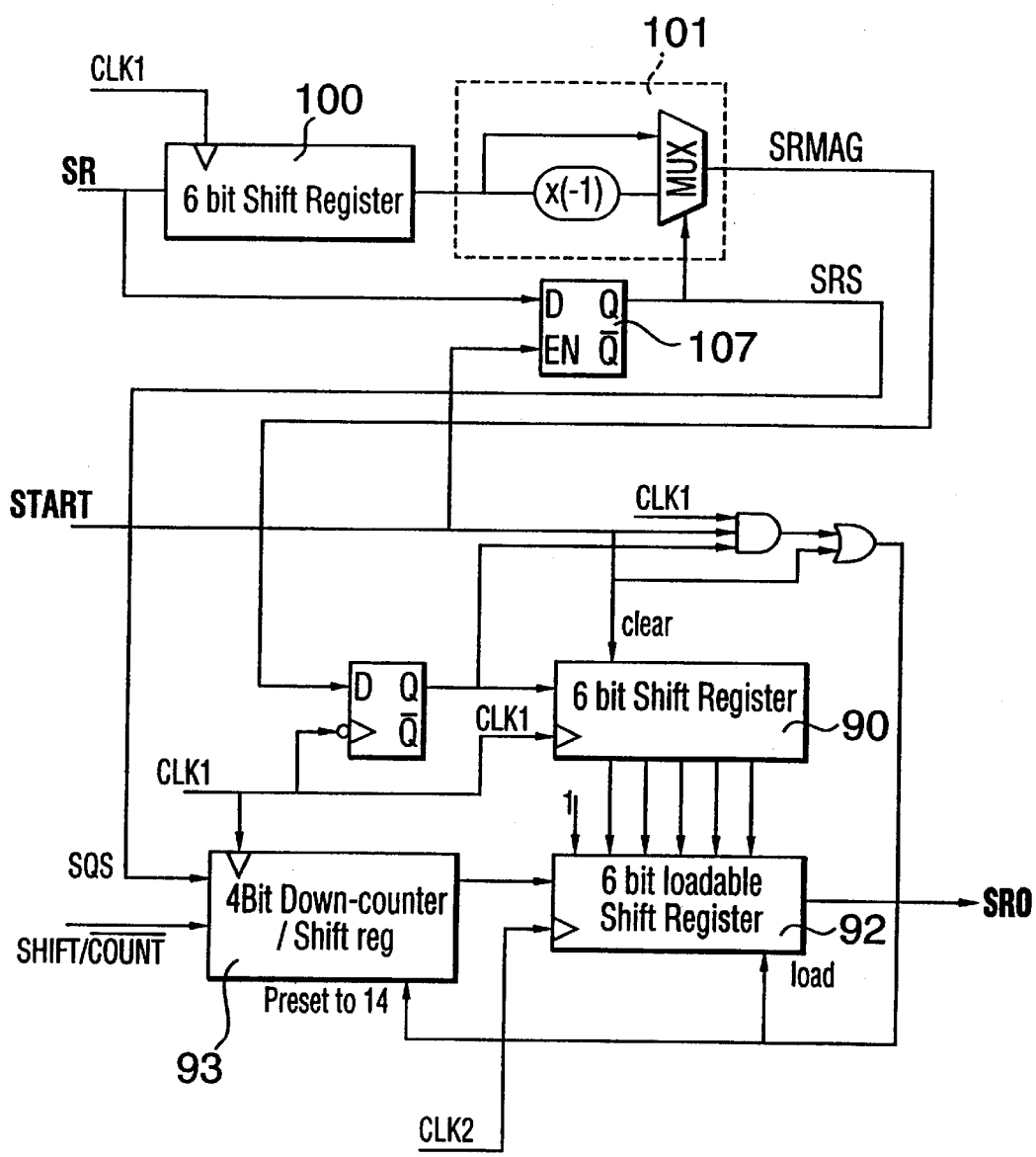
FIG. 12 shows a second floating point converter circuit (FLOATB).

The FLOATB block shown in FIG. 12 converts a 16 bit 2's complement SR signal to floating point representation for use by the FMULT floating point multipliers. The inputs and outputs of this circuit are serial format least significant bit first. The operation of this circuit is identical to that of the FLOATA circuit previously described, with the exception of the inclusion of a 2's complement to signed magnitude conversion circuit 100, 101, 102.

The circuits described show how distributed serial bit logic circuits can be applied to implement the ADPCM algorithm as defined in the CCITT specifications with economy of power and logic circuitry. It will be apparent to a person skilled in the art that the invention will find many other applications in the field of digital signal processing.

The circuits are particularly advantageous because of their very low power consumption, which is extremely valuable in small portable battery powered devices, such as telephone handsets.

I claim:

1. In a circuit for applying an adaptive differential pulse code modulation compression algorithm to an input signal, comprising an input for receiving said input signal, signal processing means for processing said input signal in accordance with said algorithm, the improvement wherein said signal processing means is implemented using distributed bit-serial logic circuits and includes an adaptive predictor having a parallel array of bit-serial floating point multipliers whose outputs are connected to respective bit serial adders, where they are summed serially to produce an output.

2. A circuit as claimed in claim 1, wherein said bit serial adders each comprise an array of logic gates and a flip-flop.

3. A circuit as claime in claim 1, implemented in the form of a single integrated chip with low power consumption.

4. A circuit as claimed in claim 1, wherein said floating point multipliers comprise a floating point converter, and a serial adder array for producing a sum of partial products of the multiplicands, one of the multiplicands being represented by a collection of static signals and the other of the multiplicands being represented by a collection of shifted serial bit streams generated by a floating point converter.

5. A circuit as claimed in claim 4, wherein said floating point multipliers further comprise an array of AND gates connected between said floating point multiplier and said serial adder array, whereby said serial bit streams are gated together through said array of AND gates prior to being applied to said serial adder array.

6. A circuit as claimed in claim 5, wherein the mantissa of said multiplicands form the inputs to said array of AND gates.

7. A circuit as claimed in claim 6, further comprising an exponent adder for adding the exponents of said multiplicands, a down counter connected to the output of said exponent adder, and further serial logic circuitry for combining the output of the down counter with the product of the mantissa to form the resulting product.

8. A circuit as claimed in claim 7, wherein the output of said further serial logic circuitry is used to derive a clock signal for a shift register receiving at its input the product of said mantissa.

9. A circuit as claimed in claim 8, wherein said further serial logic circuitry comprises logic gates and bistable flip-flops.

10. A circuit as claimed in claim 4, wherein said floating point converter comprises a shift register receiving at its input one of the multiplicands, additional shift registers for deriving the mantissa thereof, and a down counter for deriving the exponent thereof.

11. A circuit as claimed in claim 1, further comprising a floating point converter for deriving a DQO signal applied to said floating point multipliers and comprising a shift registers and a down counter.

12. A circuit as claimed in claim 1, further comprising predictor coefficient update circuits are connected to the inputs of said floating point multipliers, said predictor coefficient update circuits comprising a shift register storing a 2's complement of a filter coefficient, and logic circuitry receiving signals controlling said shift register to generate filter coefficients.

13. A circuit as claimed in claim 1, wherein said bit serial adders comprise a first AND gate connected to a pair of serial inputs, a first exclusive OR gate connected to said pair of inputs, a DQ flip flop having a Qbar output connected to a first input of a second AND gate and a first input of a second exclusive OR gate, the output of said first exclusive OR gate being connected to a second input of the second AND gate and a second input of said second exclusive OR gate, and the outputs of said first and second AND gates being connected through a NOR gate to the D input of said DQ flip-flop.

* * * * *